US006720244B2

United States Patent
Tong et al.

(10) Patent No.: US 6,720,244 B2
(45) Date of Patent: Apr. 13, 2004

(54) BUMP FABRICATION METHOD

(75) Inventors: Ho-Ming Tong, Taipei (TW); Chun-Chi Lee, Kaohsiung (TW); Jen-Kuang Fang, Pingtung Hsien (TW); Min-Lung Huang, Kaohsiung (TW); Jau-Shoung Chen, Hsinchu Hsien (TW); Ching-Huei Su, Kaohsiung (TW); Chao-Fu Weng, Tainan (TW); Yung-Chi Lee, Kaohsiung (TW); Yu-Chen Chou, Kaohsiung (TW); Tsung-Hua Wu, Kaohsiung Hsien (TW); Su Tao, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 10/248,835

(22) Filed: Feb. 24, 2003

(65) Prior Publication Data
US 2003/0166332 A1 Sep. 4, 2003

(30) Foreign Application Priority Data
Mar. 1, 2002 (TW) ........................................ 91103735 A

(51) Int. Cl.⁷ .............................................. H01L 21/44
(52) U.S. Cl. ....................................................... 438/613
(58) Field of Search .................................. 438/108, 125, 438/613; 257/724, 737

(56) References Cited

U.S. PATENT DOCUMENTS 6,617,237 B1 * 9/2003 Tong et al. .................. 438/613

\* cited by examiner

Primary Examiner—Evan Pert
Assistant Examiner—Monica D. Harrison
(74) Attorney, Agent, or Firm—Jiang Chyun IP Office

(57) ABSTRACT

A bump fabrication method is described. The method comprises the steps of providing a wafer having an active surface and a plurality of bonding pads formed on the active surface; respectively forming an under bump metallurgy layer onto the bonding pads, wherein the under bump metallurgy layer includes at least a wetting layer having an oxidized region and positioned at a top layer of the under bump metallurgy layer; patterning a masking layer on the active surface wherein the masking layer is provided with a plurality of openings to expose the wetting layers; removing the oxidized region of the wetting layer using ionic bombardment; fully forming a flux film on the active layer, wherein at least a portion of the flux film covers onto the wetting layer; filling a solder paste into the openings; performing a re-flow process to form a plurality of bumps after the solder paste melts so that the flux film removes the oxidized region of the wetting layer; and removing the masking layer.

18 Claims, 7 Drawing Sheets

BUMP FABRICATION METHOD

CROSS REFERENCE TO RELATED APPLICATIONS

This application claims the priority benefit of Taiwan application Ser. No. 91103735, filed on Mar. 1, 2002.

BACKGROUND OF INVENTION

1. Field of the Invention

The present invention relates to bump fabrication, and in particular, a bump fabrication method to increase the wettability of wetting layer of the under bump metallurgy (UBM) layer.

2. Description of the Related Art

In IC packaging technology, the first level package is the connection of chips to carrier. The common types of package are, for example, wire bonding, tape automatic bonding (TAB), flip chip (F/C), etc. However, in either TAB or F/C, in the course of bonding chips to the carrier, a bump has to be made on the pad of the wafer, and the bump is used as an electrical media for the chips and the carrier. The common types of bump, generally, are solder bump, gold bump, conductive polymer bump and polymer bump. Among all these, the solder bump is most widely applied.

FIGS. 1A to 1F there is show a conventional solder bump fabrication method. As shown in FIG. 1A, the active surface 112 of the wafer 110 is provided with a passivation layer 114 and a plurality of bonding pads 116 (only one shown).

The passivation layer 114 exposes the bonding pad 116 on the top of the active surface 112. Next, as shown in FIG. 1B, evaporation, sputter or plating method is used to form an under bump metallurgy (UBM) layer 120 on the bonding pad 116.

Next, as shown in FIG. 1C, a patterned masking layer 130 is formed on the active surface 112 of the wafer 110, using a plurality of openings 132 (one has been shown) on the masking layer 130, exposing the UBM layer 120. Next, as shown in FIG. 1D, a printing method is used to fill solder paste 140 into the space formed by the openings 132 and the UBM layer 120. After that, as shown in FIG. 1E, a re-flow process is performed such that the solder paste 140 is finally formed into a bump 142 having a ball shape.

Lastly, the masking layer 130 is removed, exposing the bump 142 on the active surface 112 of the wafer 110.

Referring to 1C to 1E, the UBM layer 120 generally comprises a wetting layer 122, a barrier layer 124 and an adhesion layer 126. The wetting layer 122 is used to bond with the bump 142, and thus, the wetting layer 122 must possess excellent wettability so as to provide better bonding between the bump 142 and the wetting layer 122. Besides, the material of the solder paste 140 includes tin (Sn), and there is excellent bonding between copper (Cu) and tin. Thus, in the course of forming the UBM layer 120, generally, copper is used as material for the wetting layer 122.

In view of the above, as copper and oxygen in the air can be easily oxidized to form copper oxide, however, the bonding between copper oxide and tin is poor. Thus, when copper is used as material for the wetting layer 122, in order to remove copper oxide formed on the wetting layer 122, the unoxidized copper underneath is exposed so as to increase the wettability of the wetting layer 122. As shown in FIG. 1C, in a conventional method, plasma ashing 150 is used to remove the copper oxide formed on the wetting layer 122 so as to expose the unoxidized copper. However, in the conventional method where plasma ashing 150 is used to remove the copper oxide of the wetting layer 122, if solder paste 140 has not filled the opening 132 on time to perform a re-flow process to form a bump, when the copper of the wetting layer 122 comes in contact with oxygen, copper will again oxidize to form copper oxide.

SUMMARY OF INVENTION

Accordingly, it is an object of the present invention to provide a bump fabrication method, wherein after the bonding pad of a wafer is formed with a UBM layer, and before the bump is formed on the UBM layer, plasma ashing is employed in sequence to remove the oxidized region of the wetting layer, exposing the unoxidized region, and after that, on the wetting layer of the UBM layer a flux film is formed instantaneously.

This can prevent the wetting layer from being oxidized again, and in the course of re-flow process, the oxidized region of the wetting layer is reduced, improving the wettability of bump on the wetting layer.

An aspect of the present invention is to provide a bump fabrication method comprising the steps of providing a wafer having an active surface and a plurality of bonding pads distributed on the active surface; respectively forming into an under bump metallurgy layer onto the bonding pads, wherein at least each of the under bump metallurgy layers includes at least a wetting layer positioned at the topmost layer of the under bump metallurgy layer; patterning a masking layer on the active surface wherein the masking layer has a plurality of openings to expose the wetting layer with oxidized region thereon; removing the oxidized region of the wetting layer using plasma ashing process; fully forming a flux film on the active layer, wherein at least a portion of the flux film covers the wetting layer; filling a solder paste into the openings; performing a re-flow process to form a plurality of bumps after the solder paste melts so that the flux film removes the oxidized region of the wetting layer; and removing the masking layer.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve the principles of the invention. In the drawings.

DETAILED DESCRIPTION

Figure 1A:
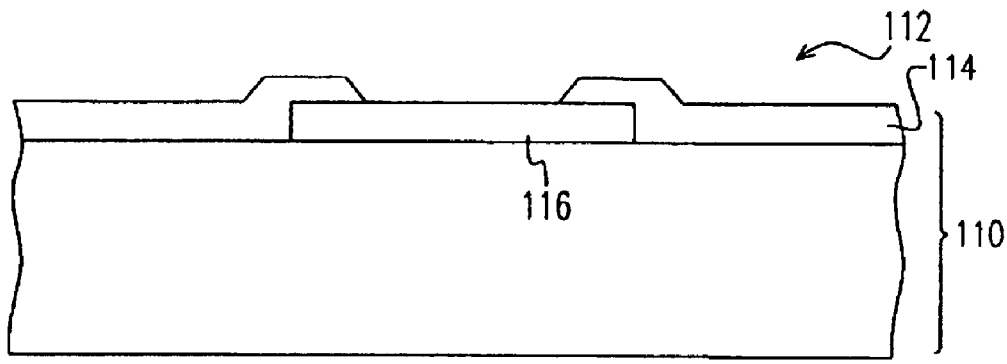
FIGS. 1A to 1F are sectional views showing a conventional bump fabrication using solder paste.
Figure 1B:
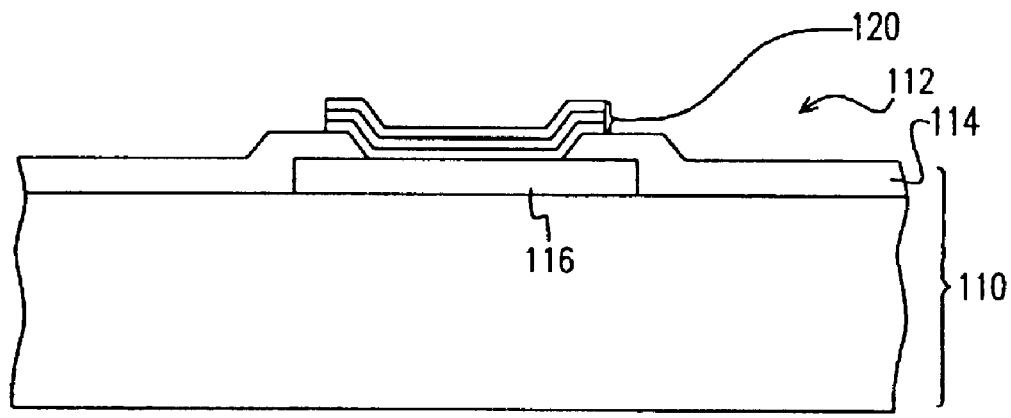
Figure 1C:
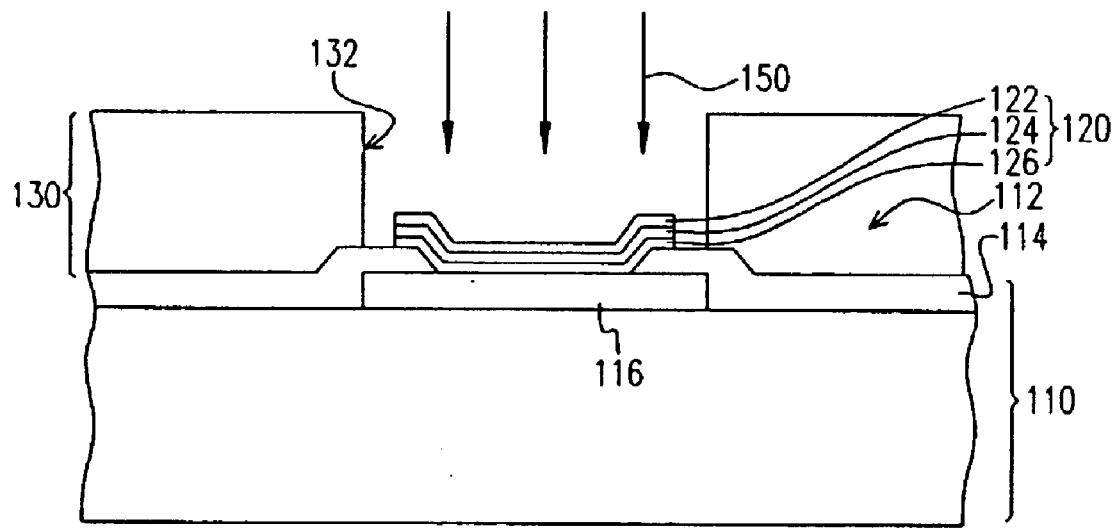
Figure 1D:
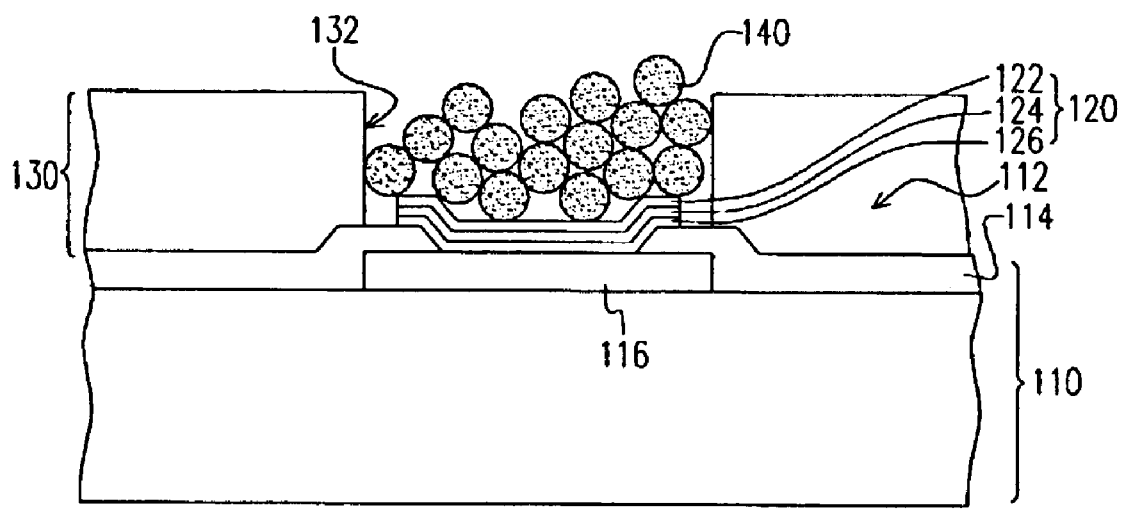
Figure 1E:
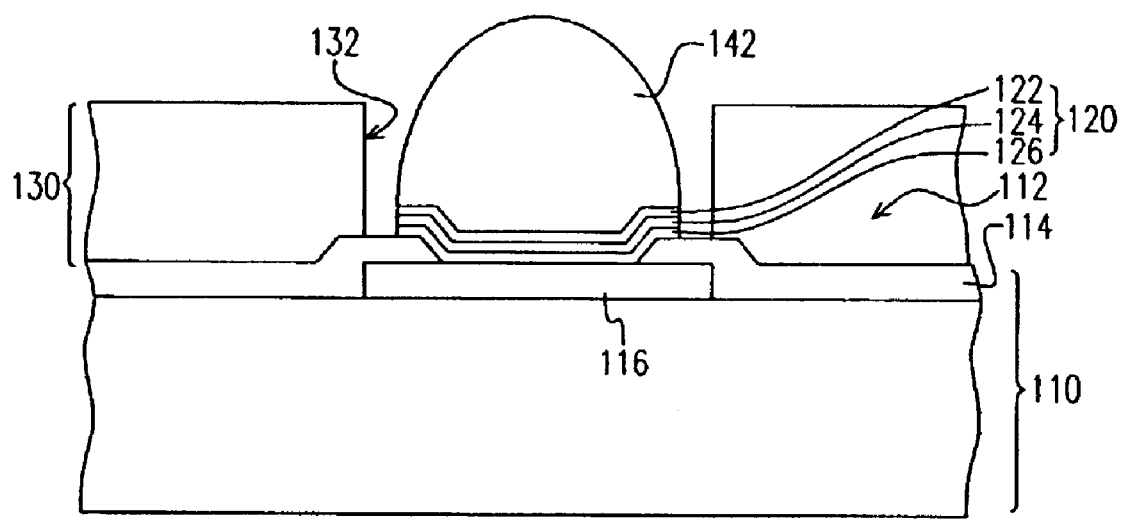
Figure 1F:
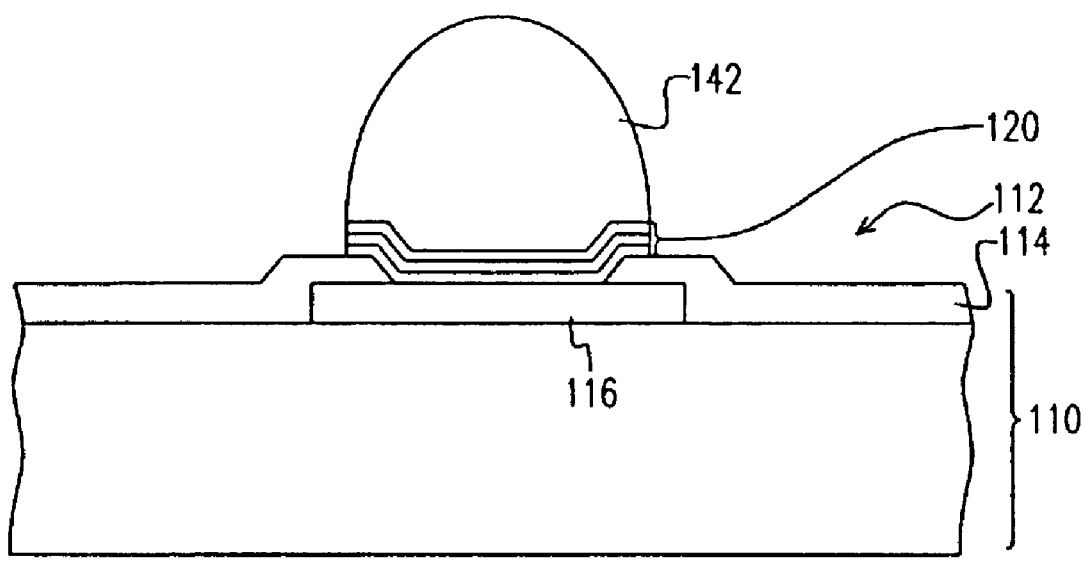

Reference will now be made in detail of the present preferred embodiments of the invention, examples of which are illustrated in the accompanying drawings. Wherever possible, the same reference numbers are used in the drawings and the description to refer to the same or like parts.

Figure 2A:
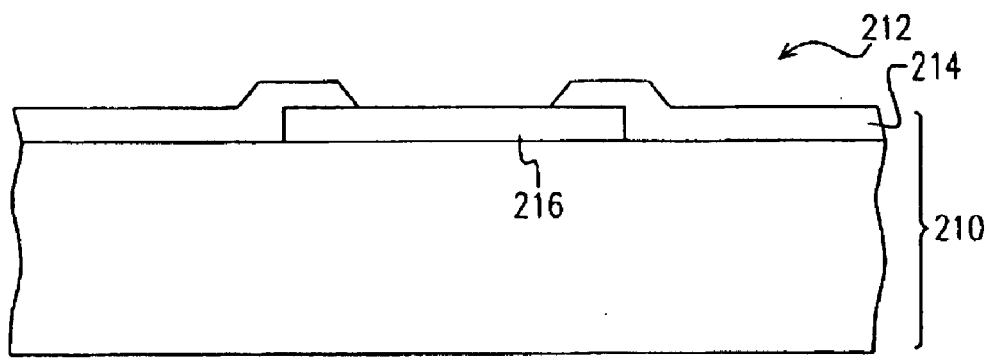
FIGS. 2A to 2H are sectional views showing the bump fabrication in accordance with the preferred embodiment of the present invention.
Figure 2B:
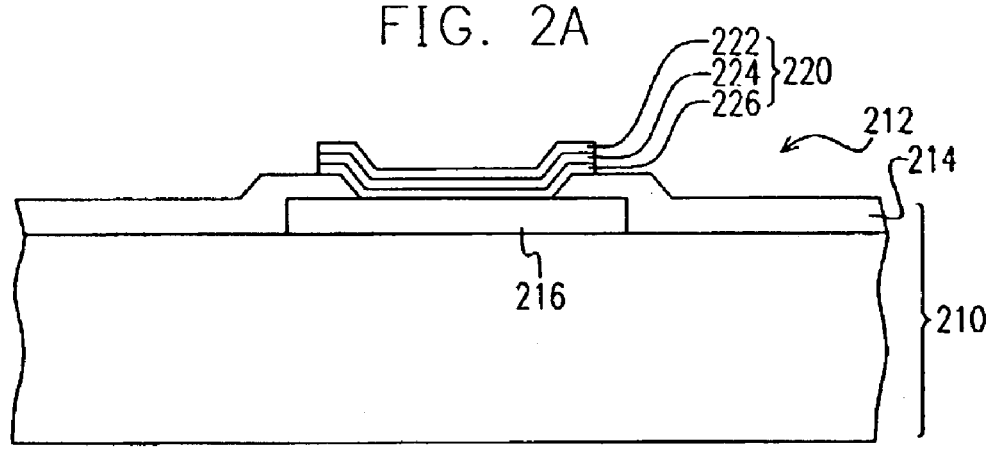

Referring to FIGS. 2A–2H, there is shown a sectional view of bump fabrication of the preferred embodiment of the present invention. As shown in FIG. 2A, the active surface 212 of the wafer 210 is provided with a protective layer 214 and a plurality of bonding pads 216 (only one has been shown). The protective layer 214 exposes the bonding pads 216 onto the active surface 212 of the wafer 210. Next, as shown in FIG. 2B, the method of evaporation, sputter or plating is used to form an under bump metallurgy layer 220 on each of the bonding pads 216. The under bump metallurgy layer 220 comprises, in sequence, a wetting layer 222, a barrier layer 224 and an adhesion layer 226.

Figure 2C:
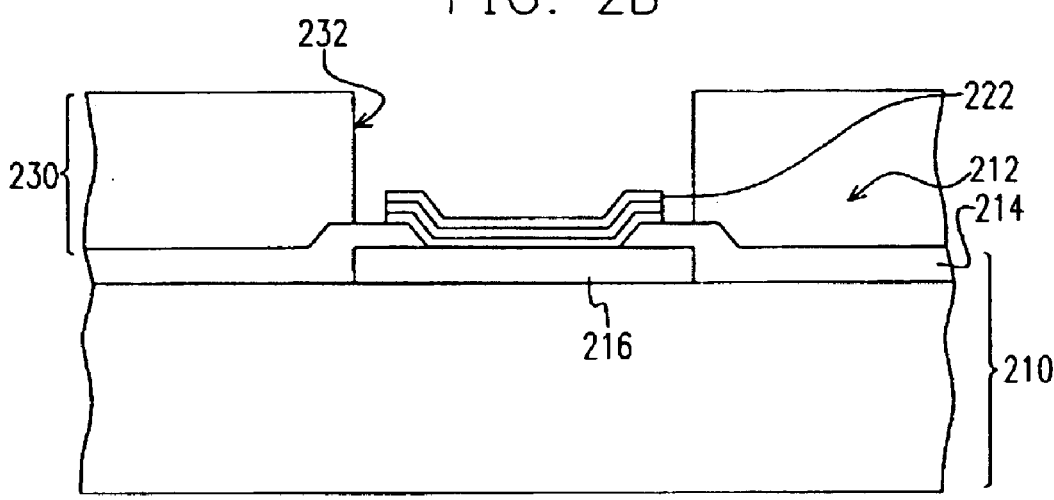
Figure 2D:
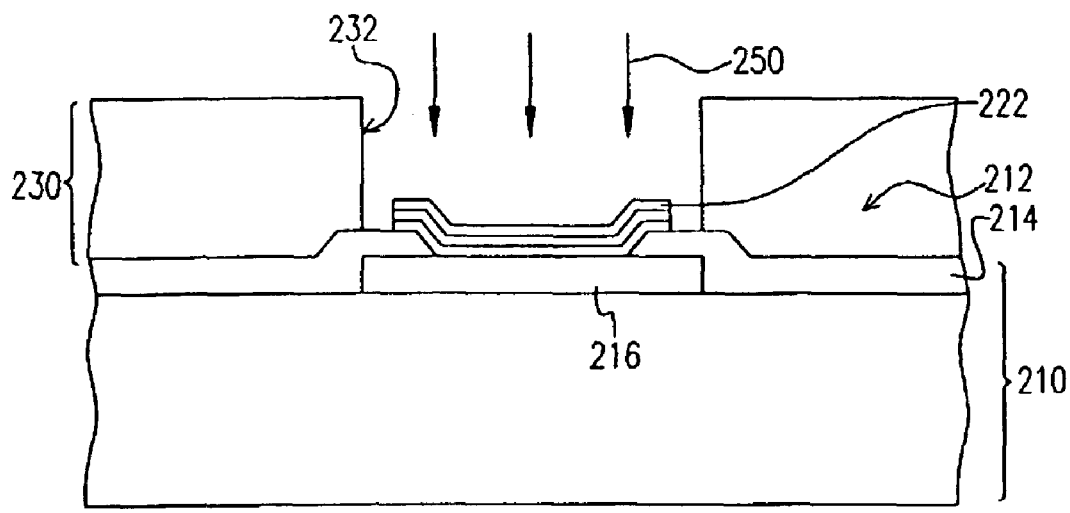
Figure 2E:
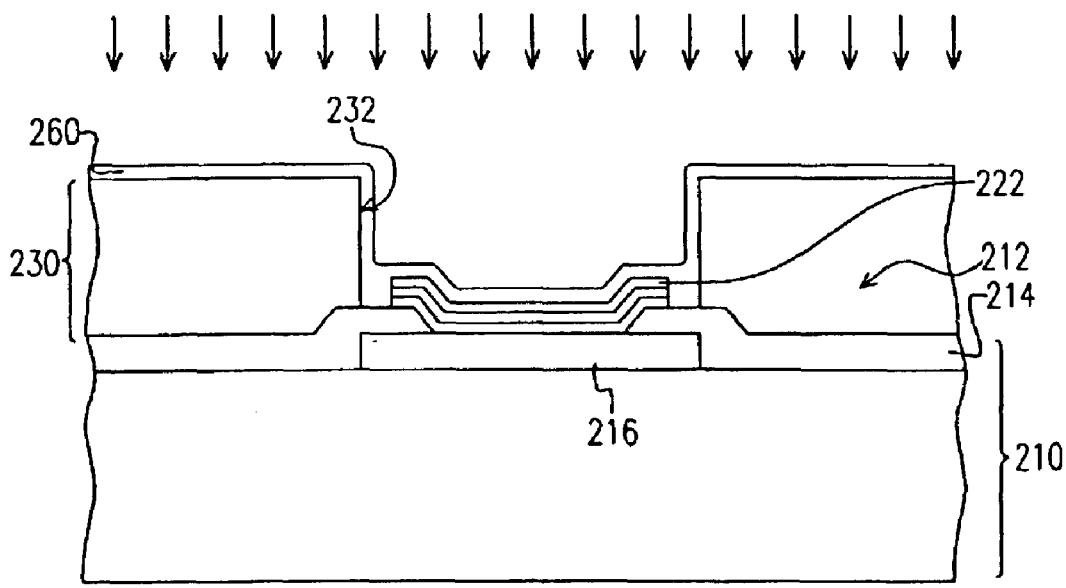
Figure 2F:
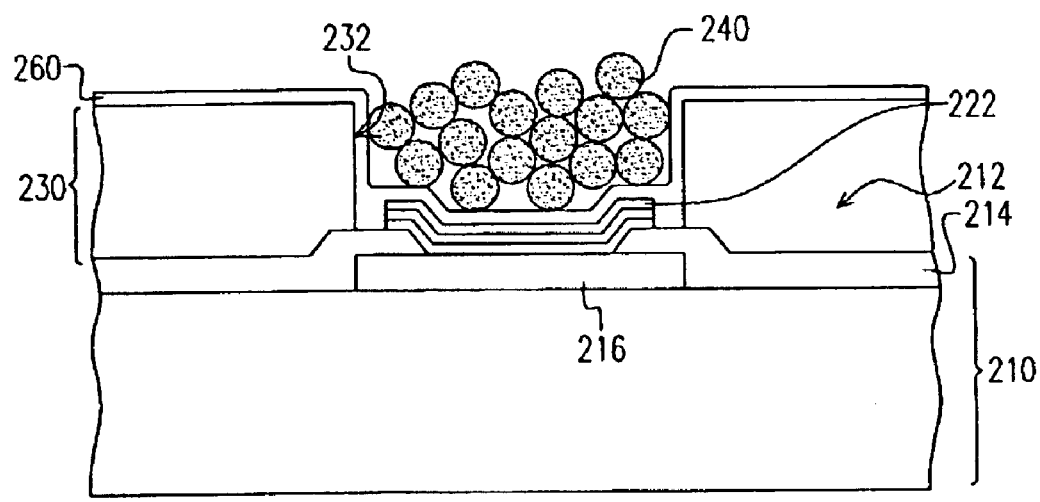
Figure 2G:
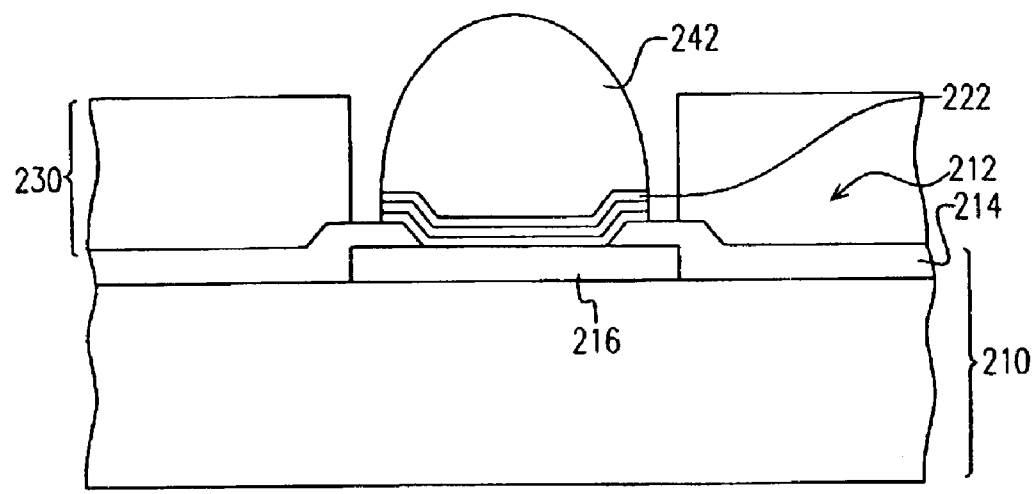
Figure 2H:
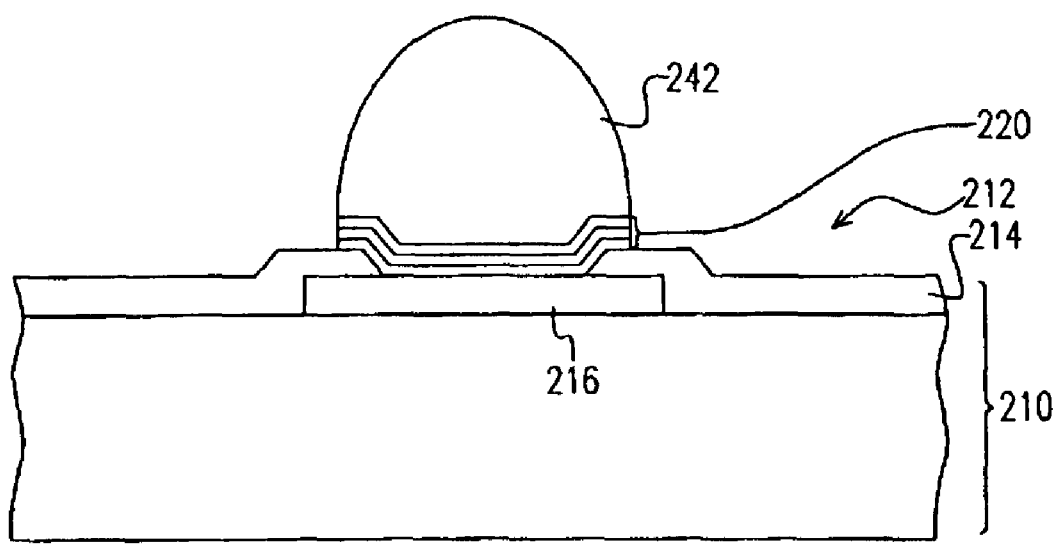

In view of the above, the wetting layer 222 is formed at the topmost layer of the under bump metallurgy layer (UBM) 220, and the function of the wetting layer 222 is to increase the bonding of UBM layer 220 with the bump 242 (as shown in FIG. 2G). The material of the wetting layer 222 is generally copper. This is due to the fact that the composition of the bump 242 includes tin, and there is a preferable bonding between copper and tin. Besides, when the material of the wetting layer 222 is copper, the function of the barrier layer 224 is used for preventing the diffusion of copper atoms to the bonding pad 216, and the function of the adhesion layer 226 is used to increase bonding between the bump 242 and the bonding pad 216.

Next, as shown in FIG. 2C, after the UBM layer 220 is formed, a patterned masking layer 230 is distributed on the active surface 212 of the wafer 210. Using a plurality of openings 232 (one has been shown) on the masking layer 230, the UBM layer 220 is exposed. The material 230 for the masking layer 230 includes dry film, photo-resist (PR) and stencil, etc.

When the dry film is used as the patterned masking layer 230, the dry film is first stacked onto the active surface 212 of the wafer 210. The photo-via method is used to pattern the photo dry film to form openings 232. Besides, when the photo-resist is used as patterned masking layer 230, the photo-resist can be rotatably coated onto the active surface 212 of the wafer 210. Similarly the photo-via method is used to pattern the photo-resist to form openings 232. Besides, when the stencil is used as a patterned masking layer 230, the stencil is first formed with opening 232 and the openings 232 of the stencil are respectively positioned correspondingly to the UBM layer 220.

As shown in FIG. 2D, when the material of the wetting layer 222 is a metal which can be oxidized easily, for example copper, due to the fact that copper can easily be bonded with oxygen in air to form copper oxide, the bonding between copper oxide and tin is poor. Thus, the oxidized region (i.e., copper oxide) of the wetting layer 222 will greatly reduce the wettability of the wetting layer 222. Thus, in order to improve the wettability of the wetting layer 222, the plasma ashing method 250 is employed so as to remove the copper oxide on the surface of the wetting layer 222, exposing the unoxidized copper underneath.

As shown in FIG. 2, after the plasma ashing method 250 is used to remove the copper oxide on the surface of the wetting layer 222, next, a flux film 260 is fully formed on the active surface 212 of the wafer 210, and at least a partial of the flux film 260 covers the wetting layer 222. Thus, the surface of the wetting layer 222 is prevented from being oxidized to become copper oxide. The method of forming flux film 260 includes spray method, flux being sprayed onto the active surface 212 of the wafer to form flux film 260.

As shown in FIG. 2F, after the flux film 260 is formed, for example, a printing method or other method is used to fill solder paste 240 into the opening 232. Next, a re-flow process is performed such that after the solder paste 240 is melted, a bump 242 as shown in FIG. 2G is formed. Finally, the masking layer 230 is removed, exposing the bump 242 on the active surface 212 of the wafer 210. It is noted that there is flux film 260 between the solder paste 240 and the wetting layer 222, and in the process of re-flow, the flux film 260 reduces the oxidized region (i.e., copper oxide) of the wetting layer 222. Thus, the wettability of the wetting layer 222 is improved, enhancing the bonding between the wetting layer 222 and the solder paste 240. At the same time, the structural strength between the bump 242 and the UBM layer 220 is increased.

In accordance with the preferred embodiment of the present invention, the plasma ashing method 250 shown in FIG. 2C can be omitted, and the flux film 260 is used to cover the wetting layer 222, and subsequently, in the re-flow process, the flux film 260 at the same time reduces the oxidized region of the wetting layer 222, so as to improve the wettability of the wetting layer 222.

In view of the above, after the formation of a UBM layer as the bonding pad of the wafer in accordance with the present invention and prior to forming a bump on the UBM layer, plasma ashing is used to remove the oxidized region (such as copper oxide) on the wetting layer, and next, a layer of flux film is formed on the wetting layer of the UBM layer. In order to keep the wetting layer from being oxidized again, in particular the oxidized portion of the copper, in the course of the re-flow process, the oxidized region of the wetting layer is reduced. Thus, the wettability of the bump on the wetting layer is increased, and the structural strength between the bump and the UBM is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bump fabrication method comprising:
   providing a wafer having an active surface and a plurality of bonding pads formed on the active surface;
   forming an under bump metallurgy (UBM) layer onto the bonding pads, wherein the under bump metallurgy layer includes at least a wetting layer having an oxidized region thereon and positioned at a top of the under bump metallurgy layer;
   patterning a masking layer on the active surface wherein the masking layer has a plurality of openings to expose the wetting layer with an oxidized region thereon;
   removing the oxidized region of the wetting layer using a plasma ashing method;
   forming a flux film over the active layer, wherein at least a portion of the flux film covers the wetting layer;
   filling a solder paste into the openings;
   performing a re-flow process to form a plurality of bumps after the solder paste meltsso that the flux film removes the oxidized region of the wetting layer; and removing the masking layer.

2. The bump fabrication method of claim 1, wherein the wetting layer includes copper, and the oxidized region of the wetting layer includes copper oxide.

3. The bump fabrication method of claim 2, wherein a composition of the solder paste includes tin.

4. The bump fabrication method of claim 1, wherein the step of forming the flux film includes spraying a flux over the active surface.

5. The bump fabrication method of claim 1, wherein the step of patterning the masking layer includes stacking a photo-sensitive film onto the active surface of the wafer and then forming a plurality of openings therein.

6. The bump fabrication method of claim 5, wherein the step of forming the openings includes the method of photo via.

7. The bump fabrication method of claim 1, wherein the step of forming the patterned masking layer includes spin coating a photo-resist onto the active surface of the wafer and then forming a plurality of openings therein.

8. The bump fabrication method of claim 7, wherein the step of forming openings includes t photo via.

9. The bump fabrication method of claim 1, wherein the patterned masking layer is a patterned stencil having a plurality of openings.

10. A bump fabrication method comprising:

providing a wafer having an active surface and a plurality of bonding pads distributed on the active surface;

respectively forming an under bump metallurgy layer onto the bonding pads, wherein the under bump metallurgy layer includes at least a wetting layer having an oxidized region thereon and positioned at a top of the under bump metallurgy layer;

patterning a masking layer on the active surface wherein the masking layer has a plurality of openings to expose the wetting layers;

forming a flux film over the active layer, wherein at least a portion of the flux film covers the wetting layer;

filling a solder paste into the openings;

performing a re-flow process to form a plurality of bumps after the solder paste melts so that the flux film removes the oxidized region of the wetting layer; and removing the masking layer.

11. The bump fabrication method of claim 10, wherein the wetting layer includes copper, and the oxidized region of the wetting layer includes copper oxide.

12. The bump fabrication method of claim 11, wherein a composition of the solder paste includes tin.

13. The bump fabrication method of claim 10, wherein the step of forming the flux film includes spraying a flux over the active surface.

14. The bump fabrication method of claim 10, wherein the step of forming the flux film includes stacking a photo-sensitive film onto the active surface of the wafer and then forming a plurality of openings therein.

15. The bump fabrication method of claim 14, wherein the step of forming the openings includes a photo via step.

16. The bump fabrication method of claim 10, wherein the step of forming the patterned masking layer includes spin coating a photo-resist over the active surface of the wafer and then forming a plurality of openings.

17. The bump fabrication method of claim 16, wherein the step of forming the openings includes forming openings by photo via.

18. The bump fabrication method of claim 10, wherein the patterned masking layer is a patterned stencil having a plurality of openings.

\* \* \* \* \*